(12) United States Patent
Fujita et al.

(10) Patent No.: US 10,267,963 B2
(45) Date of Patent: Apr. 23, 2019

(54) WAVELENGTH CONVERSION MEMBER, WAVELENGTH CONVERSION ELEMENT, AND LIGHT EMITTING APPARATUS USING THOSE

(71) Applicant: NIPPON ELECTRIC GLASS CO., LTD., Otsu-shi, Shiga (JP)

(72) Inventors: Naoki Fujita, Otsu (JP); Tadahito Furuyama, Otsu (JP); Shunsuke Fujita, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 15/763,873

(22) PCT Filed: Nov. 29, 2016

(86) PCT No.: PCT/JP2016/085370
§ 371 (c)(1),
(2) Date: Mar. 28, 2018

(87) PCT Pub. No.: WO2017/098963
PCT Pub. Date: Jun. 15, 2017

(65) Prior Publication Data
US 2018/0275324 A1    Sep. 27, 2018

(30) Foreign Application Priority Data
Dec. 10, 2015 (JP) .................. 2015-240796

(51) Int. Cl.
*F21K 9/64* (2016.01)
*G02B 5/20* (2006.01)
(Continued)

(52) U.S. Cl.
CPC ............. *G02B 5/20* (2013.01); *C09K 11/08* (2013.01); *F21K 9/64* (2016.08); *H01L 33/50* (2013.01);
(Continued)

(58) Field of Classification Search
CPC .......... G02B 5/20; C09K 11/08; C09K 11/02; C09K 11/00; C09K 11/025; H01S 5/02;
(Continued)

(56) References Cited

U.S. PATENT DOCUMENTS 5,998,925 A   12/1999  Shimizu et al.
6,069,440 A    5/2000  Shimizu et al.
(Continued)

FOREIGN PATENT DOCUMENTS

JP   2000-208815 A   7/2000
JP   2003-243717 A   8/2003
(Continued)

OTHER PUBLICATIONS

Official Communication issued in International Patent Application No. PCT/JP2016/085370, dated Feb. 21, 2017.

*Primary Examiner* — Joseph L Williams
*Assistant Examiner* — Jose M Diaz
(74) *Attorney, Agent, or Firm* — Keating and Bennett, LLP

(57) ABSTRACT

Provided are a wavelength conversion member and a wavelength conversion element which are capable of reducing the decrease in luminescence intensity with time and the melting of a component material when irradiated with light of a high-power LED or LD, and a light emitting apparatus using the wavelength conversion member or the wavelength conversion element. A wavelength conversion member contains, in % by mass, 70 to 99.9% inorganic phosphor particles and 0.1 to 30% easily sinterable ceramic particles, (Continued)

wherein the easily sinterable ceramic particles are interposed between the inorganic phosphor particles and the inorganic phosphor particles are bound together by the easily sinterable ceramic particles.

12 Claims, 1 Drawing Sheet

(51) Int. Cl.
    *H01S 5/02*         (2006.01)
    *C09K 11/08*       (2006.01)
    *H01L 33/50*       (2010.01)
    *F21Y 115/10*     (2016.01)

(52) U.S. Cl.
    CPC .......... *H01L 33/504* (2013.01); *H01L 33/505* (2013.01); *H01S 5/02* (2013.01); *F21Y 2115/10* (2016.08)

(58) Field of Classification Search
    CPC ..... H01L 33/504; H01L 33/505; H01L 33/50; H01L 33/20; H01L 33/13; F21K 9/64; F21Y 2115/10
    See application file for complete search history.

(56) References Cited

U.S. PATENT DOCUMENTS

| | | | |
|---|---|---|---|
| 9,318,646 B2 * | 4/2016 | Taguchi | ............... C09K 11/025 |
| 2008/0187746 A1 | 8/2008 | De Graaf et al. | |
| 2011/0090703 A1 | 4/2011 | Ishimori et al. | |
| 2011/0181173 A1 | 7/2011 | De Graaf et al. | |
| 2013/0141892 A1 | 6/2013 | Okazaki et al. | |
| 2013/0257264 A1 | 10/2013 | Tamaki et al. | |
| 2013/0292728 A1 | 11/2013 | Ishimori et al. | |
| 2015/0004728 A1 * | 1/2015 | Taguchi | ............... H01L 33/505 438/29 |
| 2015/0159836 A1 | 6/2015 | Tamaki et al. | |
| 2016/0230945 A1 * | 8/2016 | Inoue | ..................... H05B 33/14 |
| 2017/0137706 A1 | 5/2017 | Fujita et al. | |

FOREIGN PATENT DOCUMENTS

| | | |
|---|---|---|
| JP | 2003-258308 A | 9/2003 |
| JP | 2008-533270 A | 8/2008 |
| JP | 2011-519149 A | 6/2011 |
| JP | 4895541 B2 | 3/2012 |
| JP | 2013-247067 A | 12/2013 |
| WO | 2012/095931 A1 | 7/2012 |
| WO | 2015/178223 A1 | 11/2015 |

\* cited by examiner

[FIG. 1]
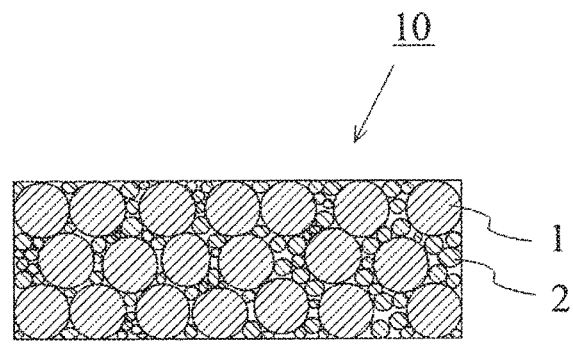
[FIG. 2]
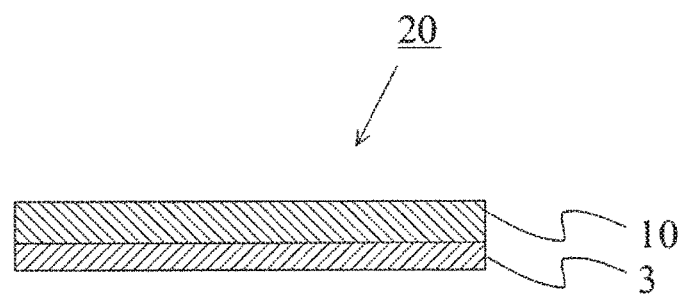
[FIG. 3]
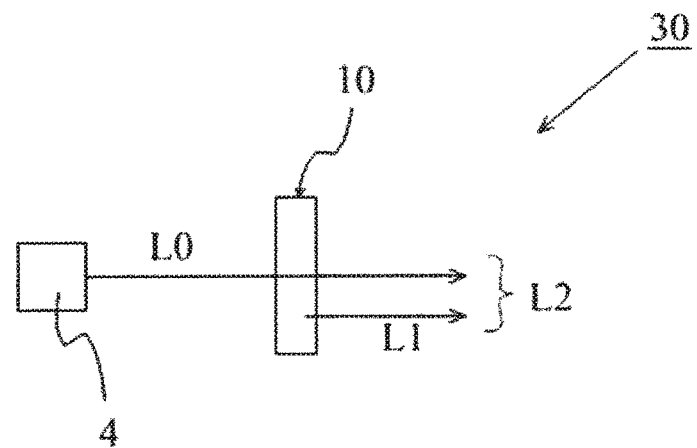

WAVELENGTH CONVERSION MEMBER, WAVELENGTH CONVERSION ELEMENT, AND LIGHT EMITTING APPARATUS USING THOSE

TECHNICAL FIELD

The present invention relates to wavelength conversion members and wavelength conversion elements for converting the wavelength of light emitted from light emitting diodes (LEDs), laser diodes (LDs) or the like to another wavelength and light emitting apparatuses using those.

BACKGROUND ART

Recently, attention has been increasingly focused on light emitting apparatuses using LEDs or LDs, as next-generation light emitting apparatuses to replace fluorescence lamps and incandescent lamps, from the viewpoint of their low power consumption, small size, light weight, and easy adjustment to light intensity. For example, Patent Literature 1 discloses, as an example of such a next-generation light emitting apparatus, a light emitting apparatus in which a wavelength conversion member is disposed on an LED for emitting a blue light and absorbs part of the light from the LED to convert it to a yellow light. This light emitting apparatus emits a white light which is a synthetic light of the blue light emitted from the LED and the yellow light emitted from the wavelength conversion member.

As a wavelength conversion member, there is conventionally used a wavelength conversion member in which inorganic phosphor particles are dispersed in a resin matrix. However, when such a wavelength conversion member is used, there arises a problem that the resin matrix is discolored or deformed by light from the LED. To cope with this, a wavelength conversion member is proposed which is formed of a fully inorganic solid in which a phosphor is dispersed and set in, instead of resin, a glass matrix (see, for example, Patent Literatures 2 and 3). This wavelength conversion member has the feature that the glass matrix serving as the matrix is less likely to be deteriorated by heat and irradiation light from the LED and therefore less likely to cause problems of discoloration and deformation.

CITATION LIST

Patent Literature

[PTL 1]
JP-A-2000-208815
[PTL 2]
JP-A-2003-258308
[PTL 3]
Japanese Patent No. 4895541

SUMMARY OF INVENTION

Technical Problem

Recently, for the purpose of giving a light emitting apparatus higher power, the power of an LED or an LD for use as its light source is increasing. Along with this, the temperature of the wavelength conversion member rises owing to heat from the light source and heat emitted from the phosphor irradiated with excitation light, resulting in the problem that the luminescence intensity decreases with time (temperature quenching). Furthermore, in some cases, the temperature rise of the wavelength conversion member becomes significant, which may melt a component material (such as the glass matrix).

In view of the foregoing, the present invention has an object of providing a wavelength conversion member and a wavelength conversion element which are capable of reducing the decrease in luminescence intensity with time and the melting of a component material when irradiated with light of a high-power LED or LD, and providing a light emitting apparatus using the wavelength conversion member or the wavelength conversion element.

Solution to Problem

A wavelength conversion member according to the present invention is a wavelength conversion member containing, in % by mass, 70 to 99.9% inorganic phosphor particles and 0.1 to 30% easily sinterable ceramic particles, wherein the easily sinterable ceramic particles are interposed between the inorganic phosphor particles and the inorganic phosphor particles are bound together by the easily sinterable ceramic particles.

In the wavelength conversion member according to the present invention, the easily sinterable ceramic particles are interposed between the inorganic phosphor particles. In this way, because the easily sinterable ceramic particles have high thermal conductivity compared to glass or the like, they can efficiently release heat generated in the inorganic phosphor particles to the outside. As a result, the temperature rise of the wavelength conversion member is reduced, so that temperature quenching becomes less likely to occur. In addition, because the easily sinterable ceramic particles have excellent thermal resistance, they have the advantage of being less likely to melt even when irradiated with light of a high-power LED or LD or the advantage of enabling reduction of the occurrence of defects, such as the development of thermal cracks, due to an abrupt temperature rise.

In the wavelength conversion member according to the present invention, the easily sinterable ceramic particles preferably have an average particle diameter of 0.01 to 10 µm. In this way, the denseness of the wavelength conversion member increases to make a heat-conducting path easy to form, so that the heat generated in the inorganic phosphor particles can be more efficiently released to the outside.

In the wavelength conversion member according to the present invention, the easily sinterable ceramic particles are preferably easily sinterable alumina particles.

In the wavelength conversion member according to the present invention, the inorganic phosphor particles preferably have an average particle diameter of 1 to 50 µm.

In the wavelength conversion member according to the present invention, the inorganic phosphor particles are preferably made of an oxide phosphor having a garnet structure. Because oxide phosphors having a garnet structure have excellent thermal resistance, the inorganic phosphor particles can reduce their own deterioration when irradiated with light of a high-power LED or LD.

In the wavelength conversion member according to the present invention, a rate of (an average particle diameter of the easily sinterable ceramic particles)/(an average particle diameter of the inorganic phosphor particles) is preferably 0.5 or less. In this way, the denseness of the wavelength conversion member increases to make a heat-conducting path easy to form, so that the heat generated in the inorganic phosphor particles can be more efficiently released to the outside.

A wavelength conversion element according to the present invention comprises a laminate in which the above-described wavelength conversion member and a heat dissipation layer having a higher thermal conductivity than the wavelength conversion member are layered. In this way, heat generated in the wavelength conversion member can be transferred to the heat dissipation layer, so that the temperature rise of the wavelength conversion member can be more easily reduced.

In the wavelength conversion element according to the present invention, a layer made of a light-transmissive ceramic may be used as the heat dissipation layer.

In the wavelength conversion element according to the present invention, the light-transmissive ceramic that can be used is at least one selected from among an aluminum oxide-based ceramic, an aluminum nitride-based ceramic, a silicon carbide-based ceramic, a boron nitride-based ceramic, a magnesium oxide-based ceramic, a titanium oxide-based ceramic, a niobium oxide-based ceramic, a zinc oxide-based ceramic, and an yttrium oxide-based ceramic.

A light emitting apparatus according to the present invention includes the above-described wavelength conversion member and a light source operable to irradiate the wavelength conversion member with excitation light.

A light emitting apparatus according to the present invention includes the above-described wavelength conversion element and a light source operable to irradiate the wavelength conversion element with excitation light.

In the light emitting apparatus according to the present invention, the light source is preferably a laser diode. Since the wavelength conversion member and wavelength conversion element according to the present invention have excellent thermal resistance and heat dissipation properties, they are easily given the effects of the invention when a laser diode having relatively high power is used as the light source.

Advantageous Effects of Invention

The present invention enables provision of a wavelength conversion member and a wavelength conversion element which are capable of reducing the decrease in luminescence intensity with time and the melting of a component material when irradiated with light of a high-power LED or LD, and provision of a light emitting apparatus using the wavelength conversion member or the wavelength conversion element.

BRIEF DESCRIPTION OF DRAWINGS

FIG. 1 is a schematic cross-sectional view showing an embodiment of a wavelength conversion member according to the present invention.

FIG. 2 is a schematic cross-sectional view showing an embodiment of a wavelength conversion element according to the present invention.

FIG. 3 is a schematic side view showing an embodiment of a light emitting apparatus according to the present invention.

DESCRIPTION OF EMBODIMENTS

Hereinafter, a description will be given of embodiments of the present invention with reference to the drawings. However, the following embodiments are merely illustrative and the present invention is not limited to the following embodiments.

(Wavelength Conversion Member)

FIG. 1 is a schematic cross-sectional view showing an embodiment of a wavelength conversion member according to the present invention. A wavelength conversion member 10 contains inorganic phosphor particles 1 and easily sinterable ceramic particles 2. In this relation, the easily sinterable ceramic particles 2 are interposed between the inorganic phosphor particles 1 and the inorganic phosphor particles 1 are bound together by the easily sinterable ceramic particles 2.

No particular limitation is placed on the type of the inorganic phosphor particles 1 so long as they emit fluorescence upon entry of excitation light. Specific examples of the type of the inorganic phosphor particles 1 that can be cited include oxide phosphors, nitride phosphors, oxynitride phosphors, chloride phosphors, oxychloride phosphors, sulfide phosphors, oxysulfide phosphors, halide phosphors, chalcogenide phosphors, aluminate phosphors, and halophosphoric acid chloride phosphors. These phosphors can be used singly or in a mixture of two or more of them. Because, as will be described hereinafter, the wavelength conversion member 10 is produced by sintering mixed particles of the inorganic phosphor particles 1 and the easily sinterable ceramic particles 2, the preferred inorganic phosphor particles 1 are those having excellent thermal resistance to avoid their thermal degradation during sintering. From this viewpoint, the inorganic phosphor particles 1 are preferably made of an oxide phosphor, particularly an oxide phosphor having a garnet structure (such as $Y_3Al_5O_{12}:Ce^{3+}$ or $Lu_3Al_5O_{12}:Ce^{3+}$).

The average particle diameter ($D_{50}$) of the inorganic phosphor particles 1 is preferably 1 to 50 μm and particularly preferably 5 to 25 μm. If the average particle diameter of the inorganic phosphor particles 1 is too small, the luminescence intensity is likely to be decreased. On the other hand, if the average particle diameter of the inorganic phosphor particles 1 is too large, the luminescent color tends to be uneven.

The easily sinterable ceramic particles 2 are low-temperature easily sinterable ceramic particles. The easily sinterable ceramic particles 2 are decreased in sintering temperature by increasing its purity or lowering its particle diameter. When the easily sinterable ceramic particles 2 are fired or even when they are fired at relatively low temperatures, for example, at 1100 to 1550° C. or ever at 1200 to 1400° C., the easily sinterable ceramic particles 2 can be densely sintered.

The average particle diameter ($D_{50}$) of the easily sinterable ceramic particles 2 is preferably 0.01 to 10 μm, more preferably 0.05 to 5 μm, and particularly preferably 0.08 to 1 μm. When the average particle diameter is within the above range, it is possible to sinter the easily sinterable ceramic particles 2 at relatively low temperatures.

The purity of the easily sinterable ceramic particles 2 is preferably 99% or more, more preferably 99.9% or more, and particularly preferably 99.99% or more. When the purity of the easily sinterable ceramic particles 2 is within the above range, it is possible to sinter the easily sinterable ceramic particles 2 at relatively low temperatures.

Examples of the easily sinterable ceramic particles 2 that can be cited include easily sinterable alumina particles and easily sinterable zirconia particles. In particular, easily sinterable alumina particles are preferred because they have excellent low-temperature sinterability. Examples of the easily sinterable alumina particles that can be used include AL-160SG series manufactured by Showa Denko K.K. and Taimicron TM-D series manufactured by Taimei Chemicals Co., Ltd.

The rate of (the average particle diameter of the easily sinterable ceramic particles 2)/(the average particle diameter of the inorganic phosphor particles 1) is preferably 0.5 or less, more preferably 0.2 or less, still more preferably 0.1 or less, and particularly preferably 0.05 or less. In this way, the denseness of the wavelength conversion member 10 increases to make a heat-conducting path easy to form, so that the heat generated in the inorganic phosphor particles 1 can be more efficiently released to the outside.

The proportions of the inorganic phosphor particles 1 and the easily sinterable ceramic particles 2 in the wavelength conversion member 10 are, in % by mass, 70 to 99.9% inorganic phosphor particles 1 and 0.1 to 30% easily sinterable ceramic particles 2, preferably 75 to 99% inorganic phosphor particles 1 and 1 to 25% easily sinterable ceramic particles 2, and more preferably 80 to 95% inorganic phosphor particles 1 and 5 to 20% easily sinterable ceramic particles 2. If the content of the inorganic phosphor particles 1 is too small (i.e., the content of the easily sinterable ceramic particles 2 is too large), excitation light and fluorescence becomes likely to be scattered by the easily sinterable ceramic particles 2, so that the luminescence intensity of the wavelength conversion member 10 becomes likely to decrease. On the other hand, if the content of the inorganic phosphor particles 1 is too large (i.e., the content of the easily sinterable ceramic particles 2 is too small), a heat-conducting path formed of the easily sinterable ceramic particles 2 becomes less likely to be formed in the wavelength conversion member 10, so that the heat generated in the inorganic phosphor particles 1 becomes less likely to be released to the outside. In addition, the bindability between the inorganic phosphor particles 1 decreases, so that the mechanical strength of the wavelength conversion member 10 becomes likely to decrease.

Although no particular limitation is placed on the shape of the wavelength conversion member 10, it normally has a plate-like shape (such as a rectangular plate-like or disc-like shape). The thickness of the wavelength conversion member 10 is preferably appropriately selected so that light having a desired color can be obtained. Specifically, the thickness of the wavelength conversion member 10 is preferably 2 mm or less, more preferably 1 mm or less, and particularly preferably 0.8 mm or less. However, because an excessively small thickness of the wavelength conversion member 10 makes it easy to decrease the mechanical strength thereof, the thickness is preferably not less than 0.03 mm.

The wavelength conversion member 10 can be produced by preliminarily forming raw material powder containing inorganic phosphor particles 1 and easily sinterable ceramic particles 2 mixed together in a predetermined ratio, and then firing the obtained preform. In this case, organic components, including a binder and a solvent, may be added to the raw material powder to form a paste and the paste may be then fired. In this way, a preform having a desired shape can be easily formed using a green sheet forming method or like methods. When, in doing so, the organic components are first removed from the paste in a degreasing process (at about 600° C.) and the paste is then fired at the sintering temperature for the easily sinterable ceramic particles 2, a dense sintered body can be easily obtained. Furthermore, after the primary firing, the preform may be subjected to HIP (hot isostatic pressing) at the firing temperature plus/minus 150° C. By doing so, vacancies in the wavelength conversion member 10 can be contracted and thus eliminated to reduce excessive light scattering.

Examples of the binder that can be used include polypropylene carbonate, polybutyl methacrylate, polyvinyl butyral, polymethyl methacrylate, polyethyl methacrylate, ethyl cellulose, nitrocellulose, and polyester carbonate and these binders can be used singly or in a mixture.

Examples of the solvent that can be used include terpineol, isoamyl acetate, toluene, methyl ethyl ketone, diethylene glycol monobutyl ether acetate, and 2,2,4-trimethyl-1, 3,-pentanediol monoisobutyrate and these solvents can be used singly or in a mixture.

A sintering aid may be contained in the paste. Examples of the sintering aid that can be used include magnesium oxide, calcium oxide, zirconium oxide, and yttrium oxide.

(Wavelength Conversion Element)

FIG. 2 is a schematic cross-sectional view showing an embodiment of a wavelength conversion element according to the present invention. A wavelength conversion element 20 comprises a laminate in which the wavelength conversion member 10 and a heat dissipation layer 3 having a higher thermal conductivity than the wavelength conversion member 10 are layered. In this embodiment, heat generated by the irradiation of the wavelength conversion member 10 with excitation light is efficiently released through the heat dissipation layer 3 to the outside. Thus, an excessive temperature rise of the wavelength conversion member 10 can be reduced.

The heat dissipation layer 3 has a higher thermal conductivity than the wavelength conversion member 10. Specifically, the thermal conductivity of the heat dissipation layer 3 is preferably 5 W/m·K or more, more preferably 10 W/m·K or more, and particularly preferably 20 W/m·K or more.

The thickness of the heat dissipation layer 3 is preferably 0.05 to 1 mm, more preferably 0.07 to 0.8 mm, and particularly preferably 0.1 to 0.5 mm. If the thickness of the heat dissipation layer 3 is too small, the mechanical strength tends to be decreased. On the other hand, if the thickness of the heat dissipation layer 3 is too large, the wavelength conversion element tends to be large in size.

A layer made of a light-transmissive ceramic can be used as the heat dissipation layer 3. In this way, the layer can transmit excitation light or fluorescence, so that the resultant wavelength conversion element can be used as a transmissive wavelength conversion element. The total light transmittance of a light-transmissive ceramic-made heat dissipation layer for wavelengths of 400 to 800 nm is preferably 10% or more, more preferably 20% or more, still more preferably 30% or more, yet still more preferably 40%, and particularly preferably 50% or more.

The light-transmissive ceramic that can be used is at least one selected from among an aluminum oxide-based ceramic, an aluminum nitride-based ceramic, a silicon carbide-based ceramic, a boron nitride-based ceramic, a magnesium oxide-based ceramic, a titanium oxide-based ceramic, a niobium oxide-based ceramic, a zinc oxide-based ceramic, and an yttrium oxide-based ceramic.

Although in the wavelength conversion element 20 according to this embodiment a heat dissipation layer 3 is formed on only one of principal surfaces of the wavelength conversion member 10, heat dissipation layers 3 may be formed on both the principal surfaces of the wavelength conversion member 10. In this way, the heat generated in the wavelength conversion member can be more efficiently released to the outside. Alternatively, the wave length conversion element may be a four or more layer laminate in which wavelength conversion members 10 and heat dissipation layers 3 are alternately layered.

Other than the layer made of a light-transmissive ceramic, the heat dissipation layer 3 may be a layer made of metal, such as Cu, Al or Ag. In this way, the resultant wavelength conversion element can be used as a reflective wavelength conversion element.

(Light Emitting Apparatus)

FIG. 3 is a schematic side view showing an embodiment of a light emitting apparatus according to the present invention. The light emitting apparatus according to this embodiment is a light emitting apparatus in which a transmissive wavelength conversion member is used. As shown in FIG. 3, the light emitting apparatus 30 includes the wavelength conversion member 10 and a light source 4. Excitation light L0 emitted from the light source 4 is converted in wavelength to fluorescence L1 having a longer wavelength than the excitation light L0 by the wavelength conversion member 10. Furthermore, part of the excitation light L0 penetrates through the wavelength conversion member 10. Therefore, the wavelength conversion member 10 emits synthetic light L2 composed of the excitation light L0 and the fluorescence L1. For example, when the excitation light L0 is a blue light and the fluorescence L1 is a yellow light, a white synthetic light L2 can be obtained. Alternatively, the above-described wavelength conversion element 20 may be used in place of the wavelength conversion member 10.

Examples of the light source 4 that can be cited include an LED and an LD. From the viewpoint of increasing the luminescence intensity of the light emitting apparatus 30, an LD capable of emitting high-intensity light is preferably used as the light source 4.

REFERENCE SIGNS LIST 1 inorganic phosphor particle
2 easily sinterable ceramic particle
3 heat dissipation layer
4 light source
10 wavelength conversion member
20 wavelength conversion element
30 light emitting apparatus

The invention claimed is:

1. A wavelength conversion member containing, in % by mass, 70 to 99.9% inorganic phosphor particles and 0.1 to 30% easily sinterable ceramic particles, wherein
   a purity of the easily sinterable ceramic particles is 99% or more, and
   the easily sinterable ceramic particles are interposed between the inorganic phosphor particles, and the inorganic phosphor particles are bound together by the easily sinterable ceramic particles.

2. The wavelength conversion member according to claim 1, wherein the easily sinterable ceramic particles have an average particle diameter of 0.01 to 10 μm.

3. The wavelength conversion member according to claim 1, wherein the easily sinterable ceramic particles are easily sinterable alumina particles.

4. The wavelength conversion member according to claim 1, wherein the inorganic phosphor particles have an average particle diameter of 1 to 50 μm.

5. The ceramic wavelength conversion member according to claim 1, wherein the inorganic phosphor particles are made of an oxide phosphor having a garnet structure.

6. The wavelength conversion member according to claim 1, wherein a rate of (an average particle diameter of the easily sinterable ceramic particles)/(an average particle diameter of the inorganic phosphor particles) is 0.5 or less.

7. A wavelength conversion element comprising a laminate in which the wavelength conversion member according to claim 1 and a heat dissipation layer having a higher thermal conductivity than the wavelength conversion member are layered.

8. The wavelength conversion element according to claim 7, wherein the heat dissipation layer is made of a light-transmissive ceramic.

9. The wavelength conversion element according to claim 8, wherein the light-transmissive ceramic is at least one selected from among an aluminum oxide-based ceramic, an aluminum nitride-based ceramic, a silicon carbide-based ceramic, a boron nitride-based ceramic, a magnesium oxide-based ceramic, a titanium oxide-based ceramic, a niobium oxide-based ceramic, a zinc oxide-based ceramic, and an yttrium oxide-based ceramic.

10. A light emitting apparatus comprising: the wavelength conversion member according to claim 1; and a light source operable to irradiate the wavelength conversion member with excitation light.

11. A light emitting apparatus comprising: the wavelength conversion element according to claim 7; and a light source operable to irradiate the wavelength conversion element with excitation light.

12. The light emitting apparatus according to claim 10, wherein the light source is a laser diode.

* * * * *